(12) United States Patent
Olgen

(10) Patent No.: US 7,912,421 B2
(45) Date of Patent: Mar. 22, 2011

(54) RADIO DEVICE

(75) Inventor: Derya Olgen, Lightwater (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/583,393

(22) PCT Filed: Dec. 15, 2004

(86) PCT No.: PCT/IB2004/004206
§ 371 (c)(1),
(2), (4) Date: Jul. 27, 2007

(87) PCT Pub. No.: WO2005/062507
PCT Pub. Date: Jul. 7, 2005

(65) Prior Publication Data
US 2007/0281644 A1    Dec. 6, 2007

(30) Foreign Application Priority Data

Dec. 19, 2003  (GB) .................................. 0329491.5

(51) Int. Cl.
*H04H 40/00* (2008.01)

(52) U.S. Cl. ....................................... 455/3.06; 348/569

(58) Field of Classification Search .................. 455/3.01, 455/186, 156, 3.06, 3.02, 427; 348/569
See application file for complete search history.

(56) References Cited

U.S. PATENT DOCUMENTS

| | | | | |
|---|---|---|---|---|
| 5,134,719 A | * | 7/1992 | Mankovitz | ................. 455/154.1 |
| 5,345,606 A | * | 9/1994 | Duckeck et al. | ........... 455/186.1 |
| 5,572,201 A | | 11/1996 | Graham et al. | |
| 5,898,910 A | | 4/1999 | Miyake et al. | |
| 6,317,882 B1 | | 11/2001 | Robbins | |
| 6,697,631 B1 | * | 2/2004 | Okamoto | ....................... 455/457 |
| 6,711,390 B1 | * | 3/2004 | Moers | ......................... 455/186.1 |
| RE38,600 E | * | 9/2004 | Mankovitz | ..................... 348/473 |
| 2002/0048105 A1 | * | 4/2002 | Shin et al. | .......................... 360/1 |
| 2003/0137605 A1 | * | 7/2003 | Chin et al. | ...................... 348/569 |
| 2004/0198279 A1 | * | 10/2004 | Anttila et al. | ............... 455/179.1 |

FOREIGN PATENT DOCUMENTS

| | | |
|---|---|---|
| CN | 1072300 A | 5/1993 |
| DE | 10122161 A1 | 11/2002 |
| EP | 0610313 B1 | 10/1992 |
| EP | 0 684 711 A1 | 11/1995 |
| EP | 0 989 695 A2 | 3/2000 |
| EP | 1 043 851 A3 | 10/2000 |
| EP | 1043851 A2 * | 10/2000 |
| JP | 63136828 A | 6/1988 |
| JP | 2003218721 A | 7/2003 |

* cited by examiner

*Primary Examiner* — Tu X Nguyen
(74) *Attorney, Agent, or Firm* — Alston & Bird LLP

(57) ABSTRACT

A mobile device for receiving supplementary information transmitted with a radio station signal, said mobile device comprising: means for scanning a spectrum of frequencies; means for detecting a plurality of radio stations broadcast within said spectrum of frequencies; means for decoding, for each of a plurality of detected radio stations, at least one piece of supplementary information broadcast in conjunction with the plurality of radio stations; means for inputting a search criterion; means for generating a set of radio stations whose supplementary information matches said search criterion; and means for selecting one of the set of radio stations whose supplementary information matches said search criterion.

19 Claims, 4 Drawing Sheets

RADIO DEVICE

FIELD OF THE INVENTION

The present invention relates to the field of frequency modulated (FM) radio receivers incorporated into multimedia devices, and in particular a method for selecting a radio station on FM radios having a data system functionality.

BACKGROUND TO THE INVENTION

A multimedia device may be a piece of mobile communication equipment such as a mobile telephone, PDA, or the like having functionality over and above an FM radio. The multimedia device may however have no electronic functions other than those of a radio receiving apparatus.

The radio data system (RDS) is intended for application to VHF/FM sound broadcasts in the range 87.5 MHz to 108 MHz; these may carry either stereophonic or monophonic programs. The main objectives of RDS are to enable improved functionality of FM receivers and to make them more user-friendly by using features such as program service (PS) name, program type (PTY) and where applicable, automatic tuning for radios incorporated into mobile devices.

RDS is defined by the European Broadcasting Union (EBU)/Cenelec Standard EN50067: 1998, "Specification of the Radio Data System". This standard is compatible with the United States radio broadcast data system defined by their National Radio Systems Committee in the specification of the radio broadcast data system, dated 9 Apr. 1998. In the following, it should be understood that the term RDS refers to both the Radio Data System and the Radio Data Broadcasting System.

FIG. 1 shows the structure of the baseband coding of the RDS standards. The largest element in the structure is called a group, consisting of 104 bits. Each group contains four blocks of 26 bits each. Each block contains an information word and a check word. Each information word comprises 16 bits, and each check word comprises 10 bits.

Each group contains message information; the message format and addressing structure are shown in FIG. 2. The first block in every group always contains a program identification (PI) code. The first four bits of the second block of every group are allocated to a 4-bit code that specifies how the information within the group is to be applied. Groups will be referred to as type 0 to 15 according to binary weighting $A_3=8, A_2=4, A_1=2, A_0=1$. For each type (0 to 15) two versions can be defined. The version is specified by a fifth bit ($B_0$) of block 2.

a) $B_0=0$: the PI code is inserted in block 1 only. This defines version A of the RDS encoding systems.

b) $B_0=1$: the PI code is inserted in block 1 and block 3 of all group types. This defines version B of the RDS encoding systems.

Each block contains a Group Type Code (GTC) defining the nature of the information word of the block.

A mixture of version A and version B groups may be transmitted on one particular FM radio station. A program type code (PTY) and the traffic program identification (TP) occupy six locations in block 2 of every group.

The PI, PTY and TP codes can be decoded without reference to any block outside the ones that contain information relating to one of these codes. This is important to minimise acquisition time for these kinds of message and to retain the advantages of the short (26-bit) block length. To permit this to be done for the PI codes in block 3 of version B groups, a special offset word (commonly defined as C') is used in block 3 of version B groups. The occurrence of offset C' in block 3 of any group can then be used to indicate directly that block 3 is a PI code, without any reference to the value of $B_0$ in block 2.

Table 1 gives the group type codes for both versions A and B of the RDS encoding system and a brief description of the data content of each group.

Table 2 gives repetition rates of some of the main features of RDS. A total of four type 0A groups are required to transmit an entire program service (PS) name, and therefore four type 0A groups are required per second according to the standard. The repetition rate of the type 0A group may be reduced if more capacity is needed for other applications. A minimum of two type 0A groups per second is necessary to ensure correct functioning of PS and alternative frequency (AF) features.

Circuits for receiving and decoding both audio and data components of an FM radio broadcast are known in the art. Indeed, an example of an FM receiver demodulator having an RDS demodulator and decoder is given in the radio broadcast data system standard.

Mobile devices, for example car stereos, incorporating FM radio receivers require frequent retuning due to spatial variation of intensity of FM radio signals. Further, the availability of radio stations varies between geographical regions. Normally, a user of a mobile radio will search a frequency band for a desired radio station, using a scan or seek function of the mobile radio. The mobile radio will scan for a signal and once locked on to a station, will receive and decode a PS code of the station in order to establish a respective program station name. The mobile radio may then display the program station name on an appropriate display means.

TABLE 1

Group Type Codes

| Group type | Group type code/version $A_3$ $A_2$ $A_1$ $A_0$ $B_0$ | Flagged in type 1A groups | Description |
|---|---|---|---|
| 0A | 0 0 0 0 0 | | Basic tuning and switching information only (see 3.1.5.1) |
| 0B | 0 0 0 0 1 | | Basic tuning and switching information only (see 3.1.5.1) |
| 1A | 0 0 0 1 0 | | Program Item Number and slow labeling codes only (see 3.1.5.2) |
| 1B | 0 0 0 1 1 | | Program Item Number (see 3.1.5.2) |
| 2A | 0 0 1 0 0 | | RadioText only (see 3.1.5.3) |
| 2B | 0 0 1 0 1 | | RadioText only (see 3.1.5.3) |
| 3A | 0 0 1 1 0 | | Applications Identification for ODA only (see 3.1.5.5) |
| 3B | 0 0 1 1 1 | | Open Data Applications |

TABLE 1-continued

Group Type Codes

| Group type | Group type code/version | | | | Flagged in type | Description |
|---|---|---|---|---|---|---|
| | $A_3$ | $A_2$ | $A_1$ | $A_0$ | $B_0$ | 1A groups | |
| 4A | 0 | 1 | 0 | 0 | 0 | | Clock-time and date only (see 3.1.5.6) |
| 4B | 0 | 1 | 0 | 0 | 1 | | Open Data Applications |
| 5A | 0 | 1 | 0 | 1 | 0 | | Transparent Data Channels (32 channels) or ODA (see 3.1.5.8) |
| 5B | 0 | 1 | 0 | 1 | 1 | | Transparent Data Channels (32 channels) or ODA (see 3.1.5.8) |
| 6A | 0 | 1 | 1 | 0 | 0 | | In House applications or ODA (see 3.1.5.9) |
| 6B | 0 | 1 | 1 | 0 | 1 | | In House applications or ODA (see 3.1.5.9) |
| 7A | 0 | 1 | 1 | 1 | 0 | Y | Radio Paging or ODA (see 3.1.5.10 and annex M) |
| 7B | 0 | 1 | 1 | 1 | 1 | | Open Data Applications |
| 8A | 1 | 0 | 0 | 0 | 0 | Y | Traffic Message Channel or ODA (see 3.1.5.12) |
| 8B | 1 | 0 | 0 | 0 | 1 | | Open Data Applications |
| 9A | 1 | 0 | 0 | 1 | 0 | Y | Emergency Warning System or ODA (see 3.1.5.13) |
| 9B | 1 | 0 | 0 | 1 | 1 | | Open Data Applications |
| 10A | 1 | 0 | 1 | 0 | 0 | | Program Type Name |
| 10B | 1 | 0 | 1 | 0 | 1 | | Open Data Applications |
| 11A | 1 | 0 | 1 | 1 | 0 | | Open Data Applications |
| 11B | 1 | 0 | 1 | 1 | 1 | | Open Data Applications |
| 12A | 1 | 1 | 0 | 0 | 0 | | Open Data Applications |
| 12B | 1 | 1 | 0 | 0 | 1 | | Open Data Applications |
| 13A | 1 | 1 | 0 | 1 | 0 | Y | Enhanced Radio Paging or ODA (see annex M) |
| 13B | 1 | 1 | 0 | 1 | 1 | | Open Data Applications |
| 14A | 1 | 1 | 1 | 0 | 0 | | Enhanced Other Networks information only (see 3.1.5.19) |
| 14B | 1 | 1 | 1 | 0 | 1 | | Enhanced Other Networks information only (see 3.1.5.19) |
| 15A | 1 | 1 | 1 | 1 | 0 | | Defined in RBDS only |
| 15B | 1 | 1 | 1 | 1 | 1 | | Fast switching information only (see 3.1.5.20) |

TABLE 2

Main feature repetition rates

| Main Features | Group types which contain this information | Appropriate repetition rate per sec. |
|---|---|---|
| Program Identification (PI) code | all | 11.4[1] |
| Program Type (PTY) code | all | 11.4[1] |
| Traffic Program (TP) identification code | all | 11.4[1] |
| Program Service (PS) name[4] | 0A, 0B | 1 |
| Alternative frequency (AF) code pairs | 0A | 4 |
| Traffic announcement (TA) code | 0A, 0B, 14B, 15B | 4 |
| Decoder identification (DI) code | 0A, 0B, 15B | 1 |
| Music/speech (M/S) code | 0A, 0B, 15B | 4 |
| Radiotext (RT) message | 2A, 2B | 0.2[2] |
| Enhanced other networks information (EON) | 14A | up to 2[3] |

[1]Valid codes for this item will normally be transmitted with at least this repetition rate whenever the transmitter carries a normal broadcast program.
[2]A total of 16 type 2A groups are required to transmit a 64 character radiotext message and therefore to transmit this message in 5 seconds, 3.2 type 2A groups will be required per second.
[3]The maximum cycle time for the transmission of all data relating to all cross-referenced program services shall be less than 2 minutes.
[4]PS must only be used for identifying the program service and it must not be used for other messages giving sequential information.

Due to the constraints of a typical mobile radio user interface, this is the only means available for searching an FM radio band. Further, due to the presence of alternative frequencies for a particular station, it is possible that the particular station may be encountered more than once during a search as described above.

An FM radio receiver with RDS may only perform a search on the whole frequency spectrum of the FM radio band. This is undesirable as a user travelling from their home region to another region may wish to listen to a particular radio station they heard while last visiting the another region, the particular radio station having a particular frequency. The user may not be able to remember the particular frequency of the particular radio station, but may be able to remember the entirety of or a portion of the radio station name.

With known FM radio receivers, the user will be forced to scan the whole frequency spectrum of the FM radio band manually in order to find the particular radio station that they wish to listen to.

It is an aim of embodiments of the present invention to solve or at least mitigate one or more of the problems described above.

SUMMARY OF THE INVENTION

According to a first aspect of the present invention there is provided a mobile device for receiving supplementary information transmitted with a radio station signal, said mobile device comprising:
  means for scanning a spectrum of frequencies;
  means for detecting a plurality of radio stations broadcast within said spectrum of frequencies;
  means for decoding, for each of a plurality of detected radio stations, at least one piece of supplementary information broadcast in conjunction with the plurality of radio stations;
  means for inputting a search criterion;
  means for generating a set of radio stations whose supplementary information matches said search criterion; and
  means for selecting one of the set of radio stations whose supplementary information matches said search criterion.

According to a second aspect of the present invention, there is provided a mobile device for receiving supplementary information transmitted with a radio station signal, said mobile device comprising:
  means for scanning a spectrum of frequencies;
  means for detecting a plurality of radio stations broadcast within said spectrum of frequencies;
  means for decoding, for each of a plurality of detected radio stations, at least one piece of supplementary information broadcast in conjunction with the plurality of radio stations;

means for storing at least one piece of supplementary information and information relating to a broadcast frequency of each of a plurality of the detected radio stations; and means for selecting one of the plurality of detected radio stations according to the supplementary information stored by said storing means.

According to a third aspect of the present invention, there is provided a method for selecting a radio station from a plurality of radio stations received by a mobile device, comprising:

scanning a spectrum of frequencies;

detecting a plurality of radio stations broadcast within said spectrum of frequencies;

decoding for each of a plurality of detected radio stations, at least one piece of supplementary information broadcast in conjunction with the plurality of radio stations;

storing at least one piece of supplementary information and information relating to a broadcast frequency of each of a plurality of the detected radio stations; and selecting one of the plurality of detected radio stations according to the supplementary information stored.

DESCRIPTION OF THE DRAWINGS

The present invention will now be described by way of example, with reference to the accompanying drawings.

DESCRIPTION OF PREFERRED
EMBODIMENTS OF THE PRESENT
INVENTION

In a preferred embodiment of the present invention, a mobile device is provided capable of generating a list of a plurality of radio stations that are received by a radio reception apparatus of the mobile device, said plurality of radio stations listed according to name information broadcast in conjunction with the audio signal. Such name information may comprise program service (PS) data broadcast in compliance with an RDS standard.

In a scan mode of a mobile device according to a preferred embodiment of the present invention, the mobile device scans the FM radio frequency spectrum and searches for FM radio stations. Upon tuning to an FM radio station, the mobile device pauses scanning and detects whether RDS data broadcast in conjunction with the FM radio station is present. If RDS data is not present, then the mobile device displays an indication that a radio station is present on a display of the multimedia device. This indication may for example be a predetermined string of text, or the frequency of the radio station. If RDS data is present, then the mobile device waits for PS data to be received, as shown in table 2, the repetition rate of PS data is at least 1 second. Hence, the mobile device is only required to pause for at most one second per radio station it finds. However, if more capacity is needed for other applications, for example alternative frequencies, this pause may be at most two seconds due to reduced repetition rate of the type 0A group that contains the PS data.

Upon receiving the PS data, the mobile station decodes the PS data in order to determine a PS name in respect of the radio station to which the device is tuned. The PS name is then displayed on the display of the multimedia device, and the mobile device resumes scanning the FM radio frequency spectrum.

In an embodiment of the present invention, the mobile device scans the whole FM radio frequency spectrum in order to obtain a list of PS names for all available radio stations. The mobile device stores in a memory the frequency of the radio station to which it is tuned when it receives the PS data. A user may then select, using a user interface of the mobile device, a radio station from the list of radio station names displayed on the display of the mobile device. Once selected, the mobile device recalls the frequency of the radio station from the memory and retunes the radio reception apparatus to that frequency. The audio signal of the radio station may then be output by the mobile device. The mobile device may also have a means for outputting information received on the RDS data stream.

Figure 1:
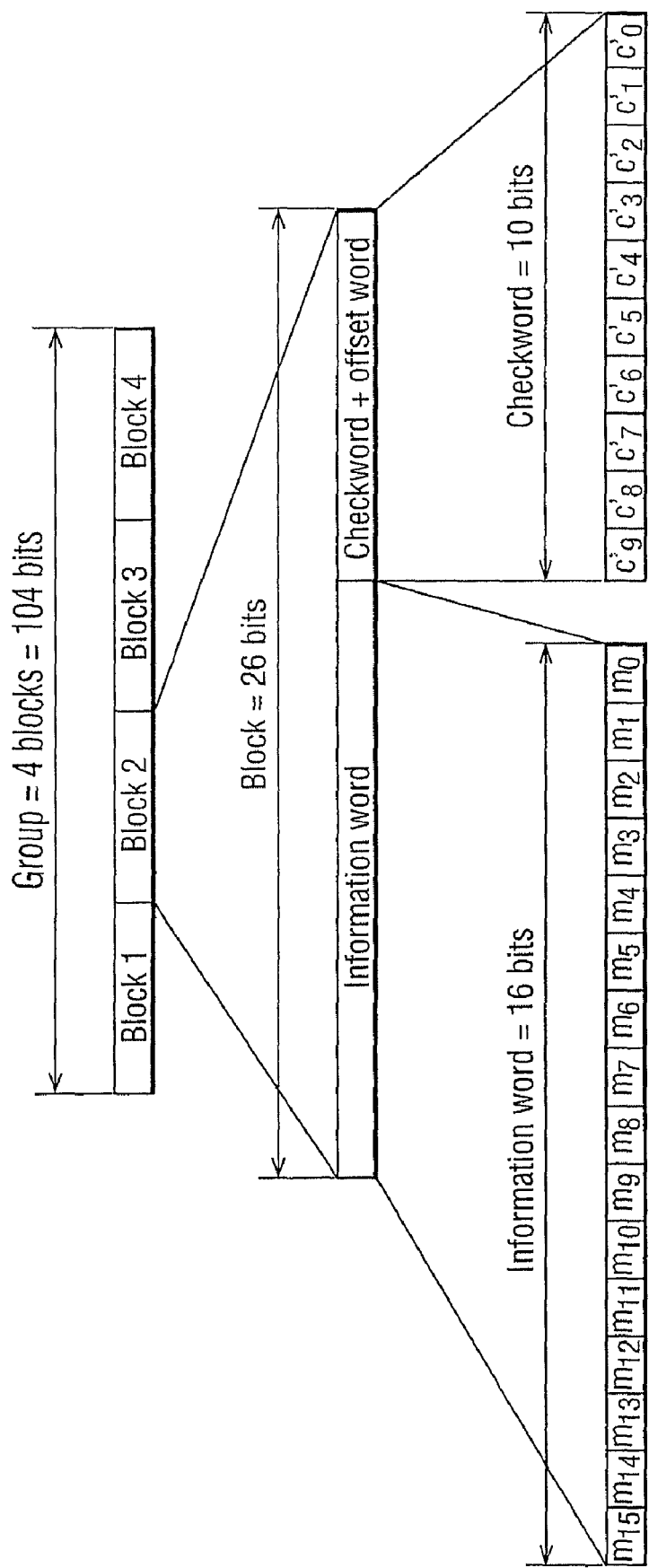
FIG. 1 shows a structure of RDS/RBDS baseband coding as is known in the art.
Figure 2:
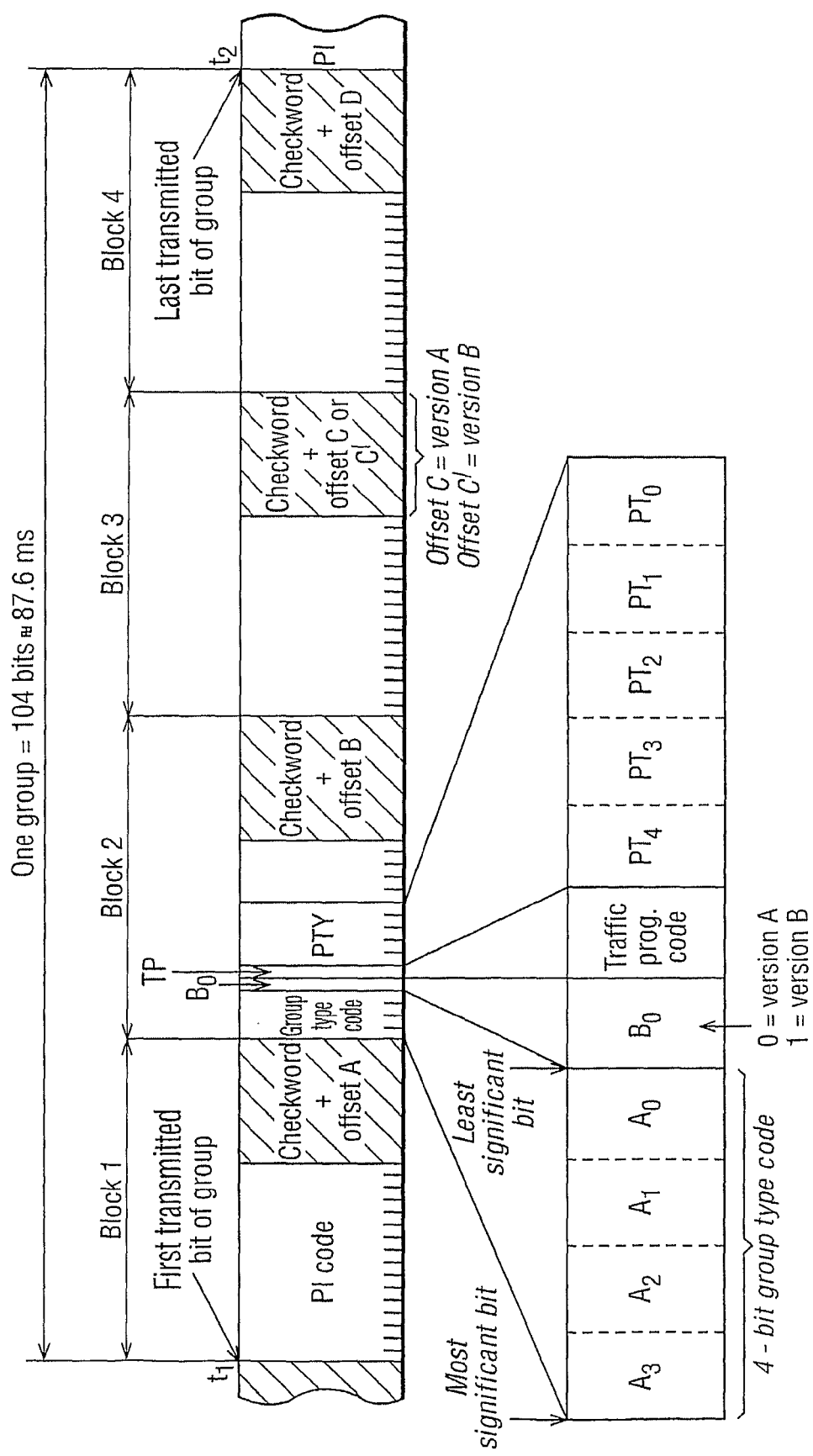
FIG. 2 shows a message format and addressing structure of the RDS signal, as is known in the art.
Figure 3A:
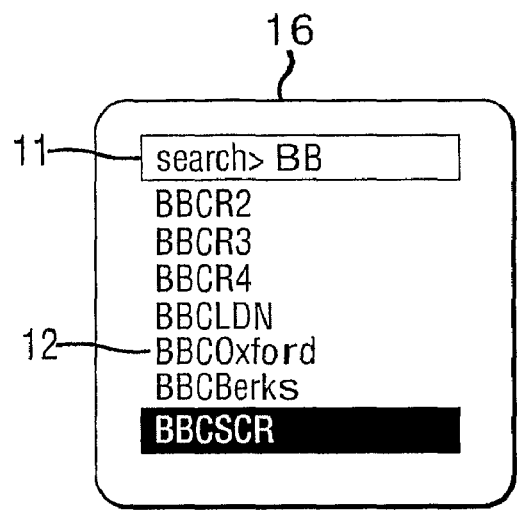
FIGS. 3A and 3B show examples of information displayed on a mobile device according to embodiments of the present invention.
Figure 3B:
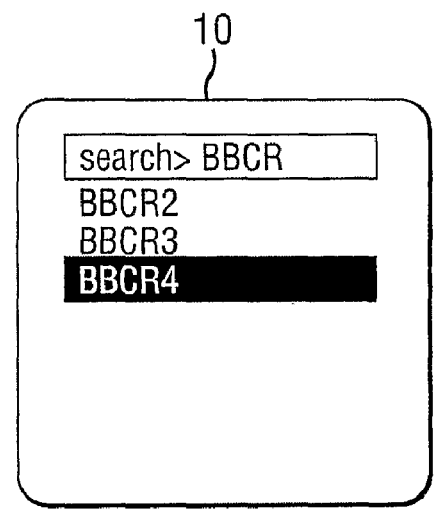

In an alternative embodiment, the user inputs one or more search criteria to the mobile device prior to initiating the scan mode. The search criteria may comprise a partial PS name of a particular radio station or a complete PS name of a particular radio station. The user may input an appropriate search criterion, and initiate the scan mode. The mobile device may then scan the FM radio frequency spectrum as described above. However, a PS name is only sent to the display 10 if the PS name matches the search criterion input by the user. The user may interrupt the scan mode of the mobile device once he recognises the PS name of the particular radio station he wishes to listen to. An example of the information displayed by the display 10 of the mobile device in this case is shown in FIGS. 3A and 3B. The search criterion the mobile device has searched under may be shown in box 11, a plurality of PS names 12 which match the search criterion are shown. As described above, the user may select one of the radio stations, the PS name 12 of which is shown on display 10.

Figure 4:
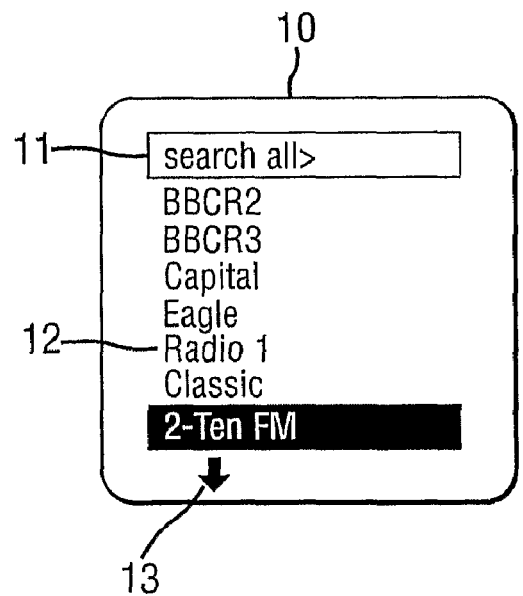
FIG. 4 shows an alternative example of information displayed on a mobile device according to embodiments of the present invention.

In another alternative embodiment, the user may instruct the mobile device to search the whole FM radio frequency spectrum. The user may do this by inputting an appropriate command, or by omitting to insert any search criterion. The user may interrupt the scan mode of the mobile device once he recognises the PS name of the particular radio station he wishes to listen to. An example of the information displayed by the display 10 of the mobile device in this case is shown in FIG. 4. A plurality of PS names 12 are shown, arrow 13 indicates that the user may scroll down in order to access more PS names listed below. As described above, the user may select one of the radio stations, the PS name 12 of which is shown on display 10.

Figure 5:
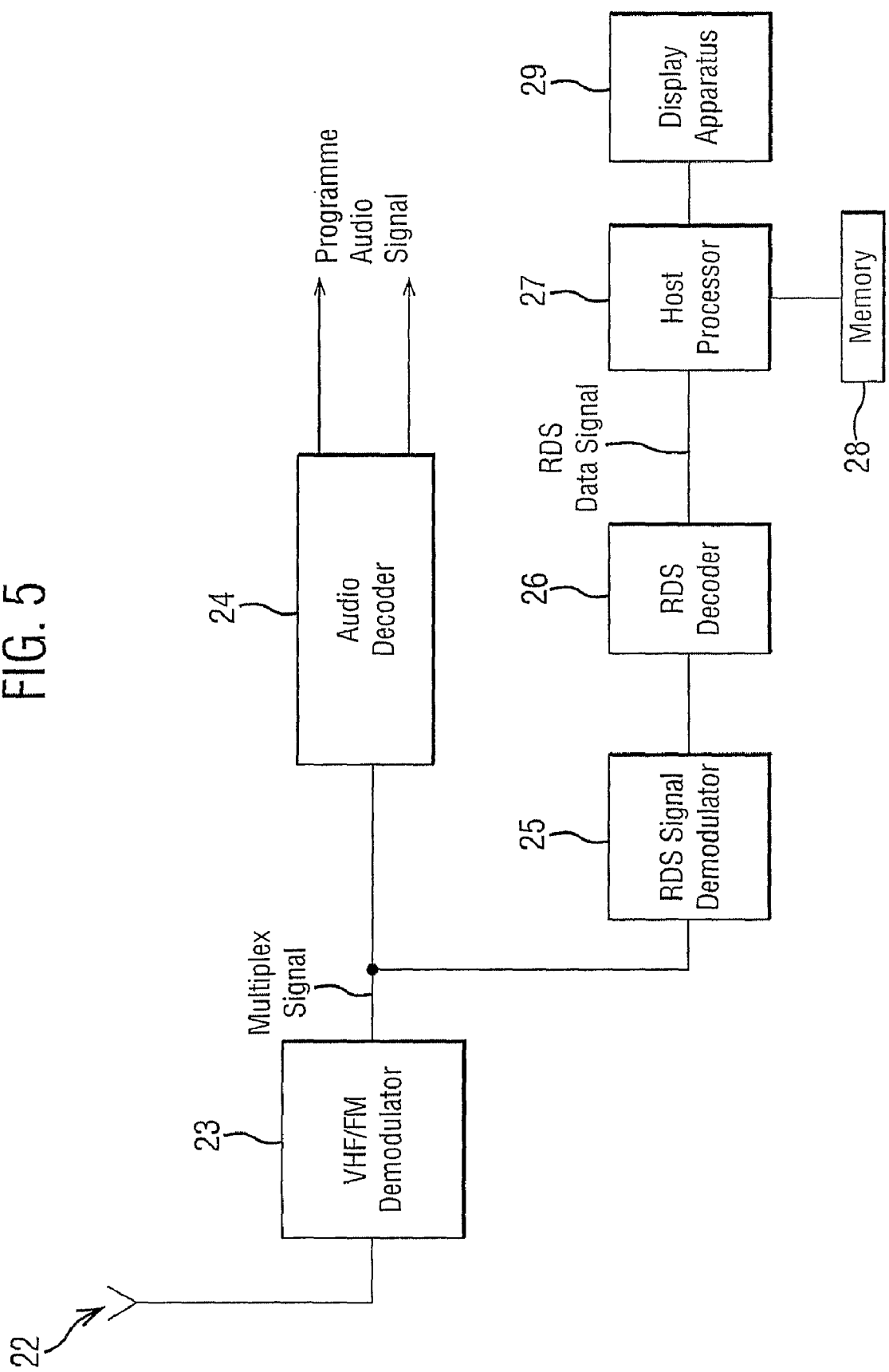
FIG. 5 shows an apparatus suitable for receiving an FM audio signal and a corresponding RDS data signal.

FIG. 5 shows a circuit suitable for receiving FM radio including an RDS demodulator 25 and an RDS decoder 26, which may be incorporated into a multimedia device. The output of the RDS decoder 26 is an RDS data signal which is input to a host processor 27 of a device.

The operation of the apparatus shown in FIG. 5 will now be described. An FM signal is received at the antenna 22 and demodulated by the very high frequency (VHF)/FM demodulator 23, which outputs a multiplexed signal to an audio decoder 24 and an RDS signal demodulator 25. The audio decoder 24 outputs a program audio signal which may consist of either a single sound channel (monophonic) or two sound channels (stereophonic). The program audio signal output by audio decoder 24 may then be amplified and used by the multimedia device. The RDS signal demodulator 25 demodulates the RDS signal from the multiplexed signal and outputs this to an RDS decoder 26. The RDS decoder 26 outputs an RDS data signal for responding to the information word of a block. The RDS decoder 26 signals an interrupt to the host processor 27 when a new data block has been decoded.

Upon receipt of a new data block, host processor 27 may store data in a memory 28. Further, if the received data block comprises PS name information, the multimedia device may update information displayed on a display apparatus comprising a display 10 of the multimedia device.

In an embodiment of the present invention, the mobile device may be a communications device capable of operating in a telecommunication system such as GSM, UMTS, or the like. Such a mobile device may comprise at least one of: a mobile phone; a personal digital assistant (PDA); a personal stereo; a personal computer; or a car stereo.

Embodiments of the present invention have been described in the context of FM radio and the RDS and RBDS standards. However, it should be appreciated that embodiments of the present invention can be used with any other type of information system featuring the broadcast of supplementary data with a radio station. This may, for example, be the SWIFT system defined in standard ETS-300751 issued by the European Telecommunications Standards Institute, or the DARC (Data Audio Radio Channel) standard developed by the Japanese firm NHK Science and Technical Research Laboratories. Alternatively, this may take the form of the inclusion of supplementary data applied to amplitude modulation broadcast stations.

Reference is made above to particular versions of the RDS and RDBS standards, it should be understood that embodiments of the present invention are relevant to these particular standards as well as future editions of these standards.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An apparatus comprising:
    means for detecting a plurality of radio stations broadcast within a spectrum of frequencies;
    means for decoding, for each of a plurality of detected radio stations, at least one piece of supplementary information broadcast in conjunction with the plurality of radio stations, the at least one piece of supplementary information comprising an associated radio station name;
    means for receiving a partial name of a radio station input by a user as a search criterion, the partial name comprising some, but not all, of the characters of a complete name of the radio station;
    means for responding to reception of the partial name of the radio station by generating a radio station name set including at least one radio station name, wherein the radio station name set is generated at least in part by using the received partial name of the radio station as a search criterion by matching the received partial name of the radio station with the supplementary information;
    means for controlling a display to display the radio station name set, including the at least one radio station name, generated by matching the received partial name of the radio station with the supplementary information; and
    means for receiving a user selection of a radio station name, the user selection being from the radio station name set displayed on the display and generated by matching the received partial name of the radio station with the supplementary information;
    wherein the supplementary information conforms to at least one of the Radio Data System standard or the Radio Broadcasting Data System standard.

2. An apparatus as claimed in claim 1, further comprising:
    means for storing the at least one piece of supplementary information broadcast in conjunction with the plurality of radio stations and information relating to a broadcast frequency of each of the plurality of the radio stations.

3. A method comprising:
    receiving a partial name of a radio station input by a user as a search criterion, the partial name comprising some, but not all, of the characters of a complete name of the radio station;
    responding to reception of the partial name of the radio station by generating a radio station name set including at least one radio station name, wherein the radio station name set is generated at least in part by using the received partial name of the radio station as a search criterion by matching the received partial name of the radio station with at least one piece of supplementary information broadcast in conjunction with a plurality of radio stations, and wherein each piece of supplementary information comprises an associated radio station name;
    controlling a display to display the radio station name set, including at least one radio station name, generated by matching the received partial name of the radio station with the supplementary information; and
    receiving a user selection of a radio station name, the user selection being from the radio station name set displayed on the display and generated by matching the received partial name of the radio station with the supplementary information;
    wherein the supplementary information conforms to at least one of the Radio Data System standard or the Radio Broadcasting Data System standard.

4. A method as claimed in claim 3, further comprising concurrently displaying a plurality of radio station names from the radio station name set.

5. A method as claimed in claim 3, further comprising displaying only one radio station name from the radio station name set.

6. A method as claimed in claim 3, wherein the radio station name set, generated by matching the received partial name of the radio station with the supplementary information, comprises a plurality of different radio station names.

7. A method as claimed in claim 3, further comprising controlling, in response to user selection of a radio station name, receiving circuitry to receive a radio station signal associated with the radio station name selected by the user.

8. A method as claimed in claim 3, wherein each piece of supplementary information comprises an associated complete radio station name, the generated radio station name set includes at least one complete radio station name, and the display is controlled to display the radio station name set including the at least one complete radio station name.

9. An apparatus comprising:
   detection circuitry configured to detect a plurality of radio stations broadcast within a spectrum of frequencies;
   decoding circuitry configured to decode, for each of a plurality of detected radio stations, at least one piece of supplementary information broadcast in conjunction with the plurality of radio stations, the at least one piece of supplementary information comprising an associated radio station name;
   input circuitry configured to receive a partial name of a radio station input by a user as a search criterion, the partial name comprising some, but not all, of the characters of a complete name of the radio station;
   filtering circuitry configured to respond to reception of the partial name of the radio station by generating a radio station name set including at least one radio station name, at least in part by using the received partial name of the radio station as a search criterion by matching the received partial name of the radio station with the supplementary information;
   control circuitry configured to control a display to display the radio station name set, including at least one radio station name, generated by matching the received partial name of the radio station with the supplementary information; and
   selection circuitry configured to receive a user selection of a radio station name, the user selection being from the radio station name set displayed on the display and generated by matching the received partial name of the radio station with the supplementary information;
   wherein the supplementary information conforms to at least one of the Radio Data System standard or the Radio Broadcasting Data System standard.

10. An apparatus as claimed in claim 9, further comprising a display configured to concurrently display a plurality of radio station names from the radio station name set.

11. An apparatus as claimed in claim 9, further comprising a display, wherein the display is configured to display only one radio station name from the radio station name set.

12. An apparatus as claimed in claim 9, wherein the radio station name set generated by matching the received partial name of the radio station with the supplementary information comprises a plurality of different radio station names.

13. An apparatus as claimed in claim 9, wherein the apparatus further comprises scanning circuitry configured to scan the spectrum of frequencies, and said selection circuitry is configured to interrupt said scanning circuitry in response to a user selection of a radio station name.

14. An apparatus as claimed in claim 9, further comprising receiving circuitry configured to receive radio station signals and decoding circuitry configured to decode radio station signals.

15. An apparatus as claimed in claim 14, wherein the radio station signals comprise audio signals and the apparatus comprises a speaker configured to provide an audio signal to a user.

16. An apparatus as claimed in claim 14, wherein the selection circuitry is configured to control, in response to user selection of a radio station name, the receiving circuitry to receive a radio station signal associated with the radio station name selected by the user.

17. An apparatus as claimed in claim 9 further comprising:
   memory configured to store the at least one piece of supplementary information broadcast in conjunction with the plurality of radio stations and information relating to a broadcast frequency of each of the plurality of the radio stations.

18. An apparatus as claimed in claim 9, wherein the at least one piece of supplementary information comprises an associated complete radio station name, the filtering circuitry is configured to respond to reception of the partial name of the radio station by generating a radio station name set including at least one complete radio station name, and the control circuitry is configured to control the display to display the radio station name set, including at least one complete radio station name.

19. A computer program product comprising at least one tangible computer-readable memory having computer-readable program instructions stored therein, the computer-readable program instructions configured to instruct a computer to carry out a method, comprising:
   receiving a partial name of a radio station input by a user as a search criterion, the partial name comprising some, but not all, of the characters of a complete name of the radio station;
   responding to reception of the partial name of the radio station by generating a radio station name set including at least one radio station name, wherein the radio station name set is generated at least in part by using the received partial name of the radio station as a search criterion by matching the received partial name of the radio station with at least one piece of supplementary information broadcast in conjunction with a plurality of radio stations, and wherein each piece of supplementary information comprises an associated radio station name; and
   receiving a user selection of a radio station name, the user selection being from the radio station name set displayed on the display and generated by matching the received partial name of the radio station with the supplementary information;
   wherein the supplementary information conforms to at least one of the Radio Data System standard or the Radio Broadcasting Data System standard.

* * * * *